United States Patent
Wu et al.

(10) Patent No.: US 7,091,590 B2
(45) Date of Patent: Aug. 15, 2006

(54) MULTIPLE STACKED-CHIP PACKAGING STRUCTURE

(75) Inventors: Wan Hua Wu, Taoyuan (TW); Kai Chiang Wu, Hsinchu (TW)

(73) Assignee: Global Advanced Packaging Technology H.K. Limited, Kowloon (HK)

( * ) Notice: Subject to any disclaimer, the term of this patent is extended or adjusted under 35 U.S.C. 154(b) by 250 days.

(21) Appl. No.: 10/637,670

(22) Filed: Aug. 11, 2003

(65) Prior Publication Data
US 2005/0035461 A1 Feb. 17, 2005

(51) Int. Cl.
*H01L 23/02* (2006.01)
(52) U.S. Cl. .................. 257/686; 257/684; 257/685; 438/107; 438/108; 438/109
(58) Field of Classification Search ............... 257/684, 257/685, 686, 77; 438/107, 108, 109
See application file for complete search history.

(56) References Cited

U.S. PATENT DOCUMENTS 6,414,384 B1 * 7/2002 Lo et al. ................ 257/685
2002/0125580 A1 * 9/2002 Wang et al. ............ 257/777
2002/0140073 A1 * 10/2002 Pai et al. ............... 257/686
2002/0171136 A1 * 11/2002 Hiraoka et al. ......... 257/684
2003/0062628 A1 * 4/2003 Lee et al. .............. 257/777
2003/0178715 A1 * 9/2003 Sturcken et al. ........ 257/686

* cited by examiner

*Primary Examiner*—David Nelms
*Assistant Examiner*—Long Tran
(74) *Attorney, Agent, or Firm*—Rosenberg, Klein & Lee

(57) ABSTRACT

The invention provides a multiple stacked-chip packaging structure, including: at least one lower layer chip located on a substrate, wherein a plurality of wires are electrically connected to the bonding pads on the lower layer chip and to the substrate; at least one carrier cap provided on the lower layer chip to provide an accommodating space to the bonding pads and the wires on the lower layer chip; at least one upper layer chip provided on the carrier cap, wherein a plurality of wires are electrically connected to the bonding pads on the upper layer chip and to the substrate; and finally, a Molding Compound used to wrap up the foregoing components. The advantages of the invention are that the invention is not limited by the layout patterns of bonding pads on the chip, that the needed chips can be placed on either the upper layer or the lower layer structure according to the requirement, and that the degree of coplanar can be ensured when performing wire bonding on the upper layer chip so as to facilitate the wire bonding process.

5 Claims, 6 Drawing Sheets

MULTIPLE STACKED-CHIP PACKAGING STRUCTURE

BACKGROUND OF THE INVENTION

1. Field of the Invention

The invention relates to a multiple stacked-chip packaging structure and, more particularly, to a multiple stacked-chip packaging structure that is not subject to the layout patterns of bonding pads on the chip and is capable of protecting the lower chip and wires.

2. Description of the Related Art

As shown from FIG. 1A to FIG. 1C, the layout patterns of bonding pads 12, 16 & 20 on chips 10, 14 & 18 respectively are generally divided into three categories: peripheral type, middle type, and mixed type. When the wire bonding of multiple stacked-chip packaging is performed, it is quite impossible to place the middle type or mixed type chip on the lower layer with the conventional wire bonding technique because the upper layer chip will result in wire damage on the lower layer chip. Or, worse still, an open or short circuit of the wire can be resulted in, which eventually will fail the whole packaging body.

There have been many solutions proposed to solve the problem caused by protecting wire bonding on the lower structure of middle type or mixed type chip. As shown in FIG. 2, a middle-type chip 32 is located on a substrate 30 that has a groove in the middle of it, and a bonding pad (not shown) is located inside the groove facing downwards. In addition, a plurality of wires 34 are electrically connected to the bonding pads on the middle-type chip 32 and to the substrate 30, whereas another chip 36 is located on the middle-type chip 32, and a plurality of wires 38 are electrically connected to the bonding pads on the chip 36 and to the substrate 30. Finally, a molding compound 40 is used to seal up all the components. However, when the above method is in practice, a problem may occur; that is, a technique that is able to perform wire bonding at one side and not to impair wires at the other side is required during the operation. Unfortunately, the conventional processing technique is hard to achieve the required technique. Therefore, the method is problematic in real practice.

Next, another solution is to employ a nonconductive adhesive layer with strong adhesive to cover the wires of lower layer chip, and a height that is taller than the height of nonconductive adhesive layer of the wires on the lower layer chip has to be maintained. Also, as shown in FIG. 3, a lower layer chip 44 is located on the substrate 42, and a plurality of wires 46 are connected to the bonding pads (not shown) and to the substrate 42. Then, a nonconductive adhesive layer 48 is used to cover the lower layer chip 44 and the wires 46. After that, an upper layer chip 50 is provided on the nonconductive adhesive layer 48, and a plurality of wires 52 are electrically connected to the bonding pads (not shown) of the upper layer chip 50 and to the substrate 42. Finally, a molding compound 54 is used to seal up all the components. However, the degree of coplanar of a thicker nonconductive adhesive layer 48 is not easy to be controlled. Therefore, the wire bonding process of the upper layer chip 50 will be difficult. Consequently, the nonconductive adhesive layer 48 has to rely on the elements of the filler to maintain its own thickness. Yet, another problem may follow; that is, the lower layer wires may be impaired and therefore an open or short circuit problem may be resulted in since the nonconductive adhesive layer 48 will be softened and flattened during a subsequent high-temperature processing such as a reflow. Therefore, the method is not easy to be implemented, either.

In viewing the above-mentioned problems, the invention provides a multiple stacked-chip packaging structure to cope with the conventional shortcomings.

SUMMARY OF THE INVENTION

The main and first object of the invention is to provide a multiple stacked-chip packaging structure, which can be designed freely and thus will not be limited by the layout patterns of bonding pads on the chip so that the middle type or mixed type chip can be placed on the upper layer or lower layer of the structure and the wires on the lower layer chip will not be impaired.

The second object of the invention is to provide a multiple stacked-chip packaging structure, which employs the design of carrier cap to ensure the degree of coplanar when performing wire bonding on the upper layer chip so as to facilitate the wire bonding process. By such design, the conventional problem that the degree of coplanar of nonconductive adhesive layer is not easy to be controlled can be resolved, and the fixed space between the upper layer and the lower layer can be maintained so as to protect the wires on the lower layer chip.

The third object of the invention is to provide a multiple stacked-chip packaging structure, which can provide a better way for heat dissipating so as to enhance heat-dissipating capability of the overall packaging structure.

The fourth object of the invention is to provide a multiple stacked-chip packaging structure, which incorporates the conventional wire-bonding process into the present sophisticated technique for manufacturing; therefore, it can reduce the process cost effectively.

To achieve the foregoing objects, the invention includes at least one substrate; at least one lower layer chip that is located on the substrate, wherein a plurality of wires are electrically connected to the bonding pads on the lower layer chip and to the substrate; at least one carrier cap that is located on the lower layer chip to provide accommodating space for the bonding pads and the wires; at least one upper layer chip that is located on the upper surface of carrier cap, wherein a plurality of wires are electrically connected to the bonding pads on the upper layer chip and to the substrate; and a molding compound that is used to wrap up the above-mentioned components.

The objects and technical contents of the invention will be better understood through the description of the following embodiments with reference to the drawings.

DESCRIPTION OF THE PREFERRED EMBODIMENTS

The invention utilizes a design of carrier cap to achieve an effect of multiple stacked-chip and not to be limited by the layout patterns of bonding pads on the chip so that the needed chips can be placed on the structure of upper layer or lower layer according to the requirement. Besides, the heat-dissipating effect can be increased, and the process cost can be lowered as well.

Figure 1C:
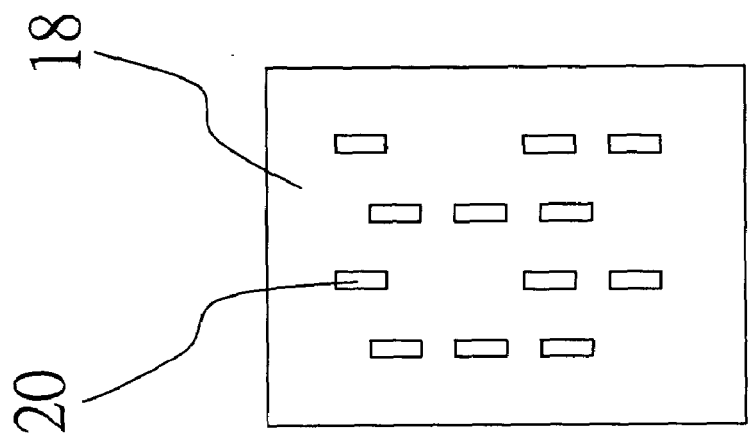
FIG. 1A to FIG. 1C are top views showing different layout patterns of bonding pads on the chip.
Figure 1B:
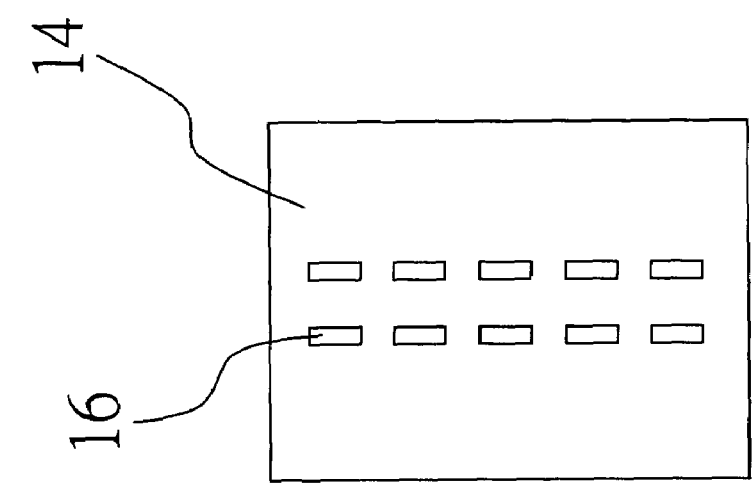
Figure 1A:
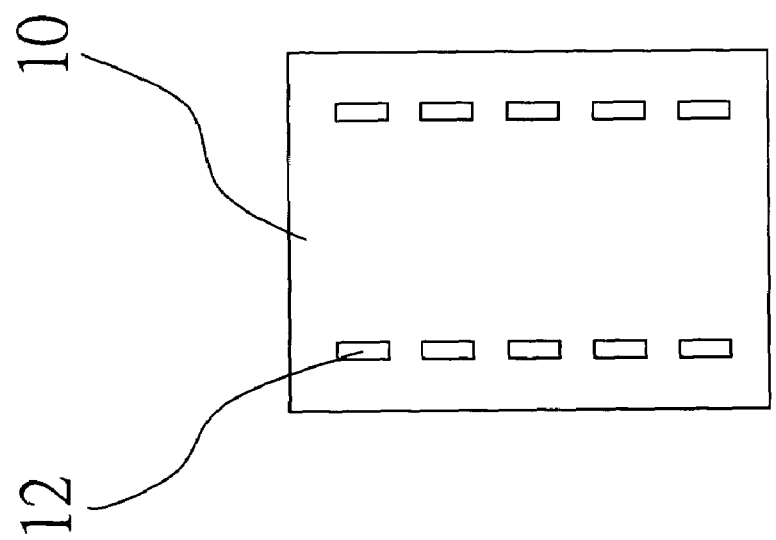
Figure 2:
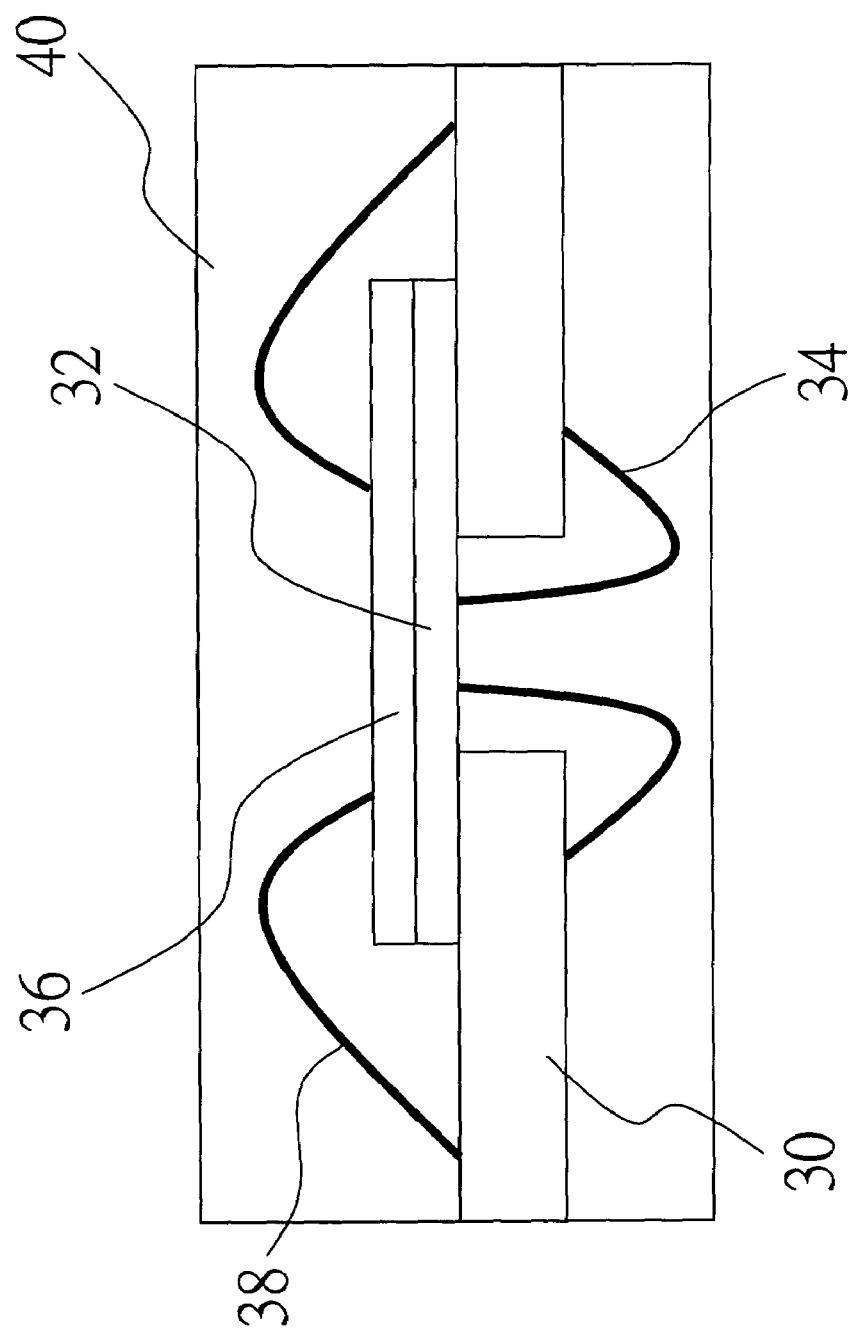
FIG. 2 is a sectional view showing a packaging structure of conventional bonding pads placed on the lower layer chip facing downwards.
Figure 3:
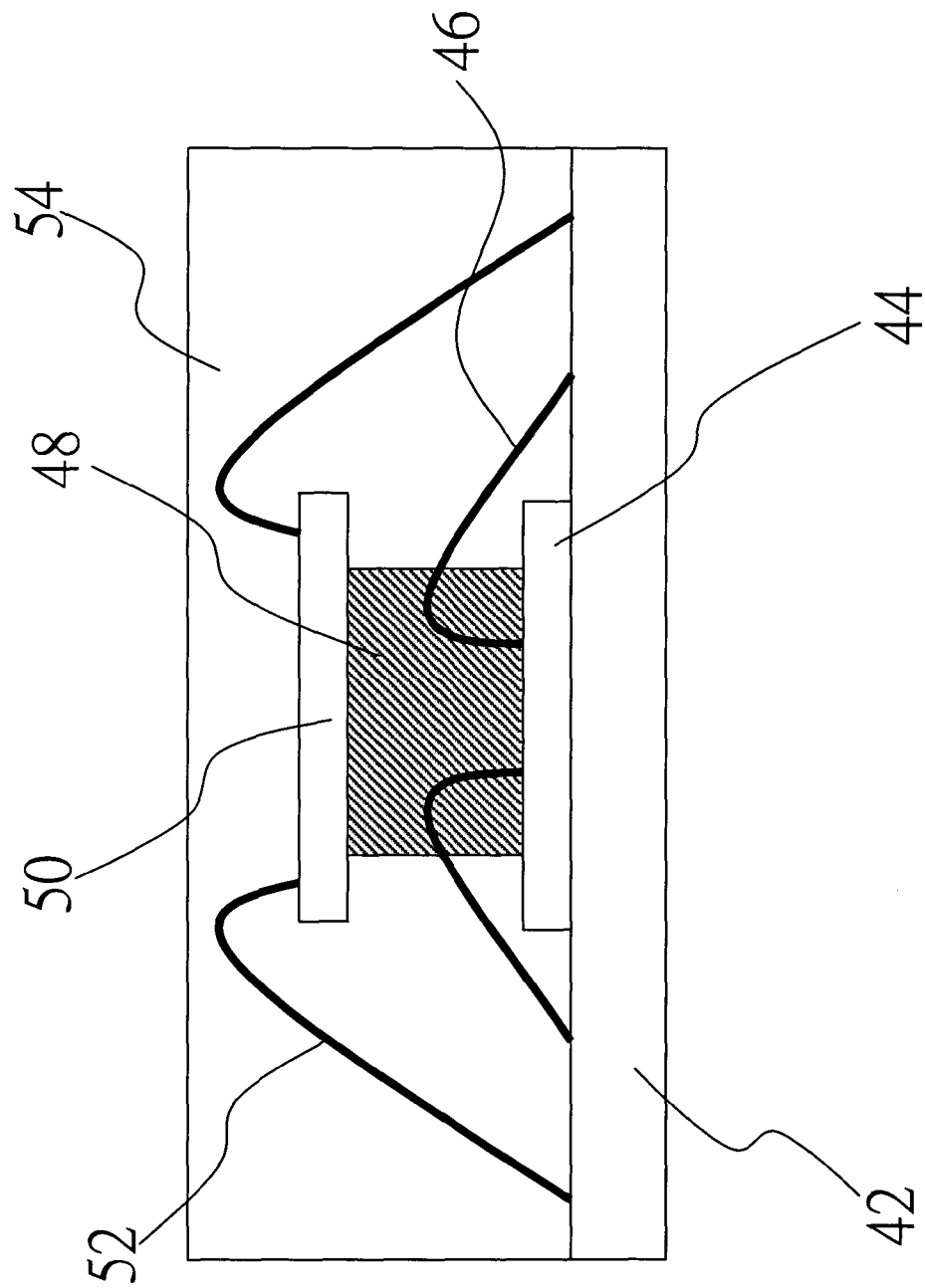
FIG. 3 is a sectional view showing a packaging structure that uses a conventional nonconductive adhesive layer to divide two chips.
Figure 4:
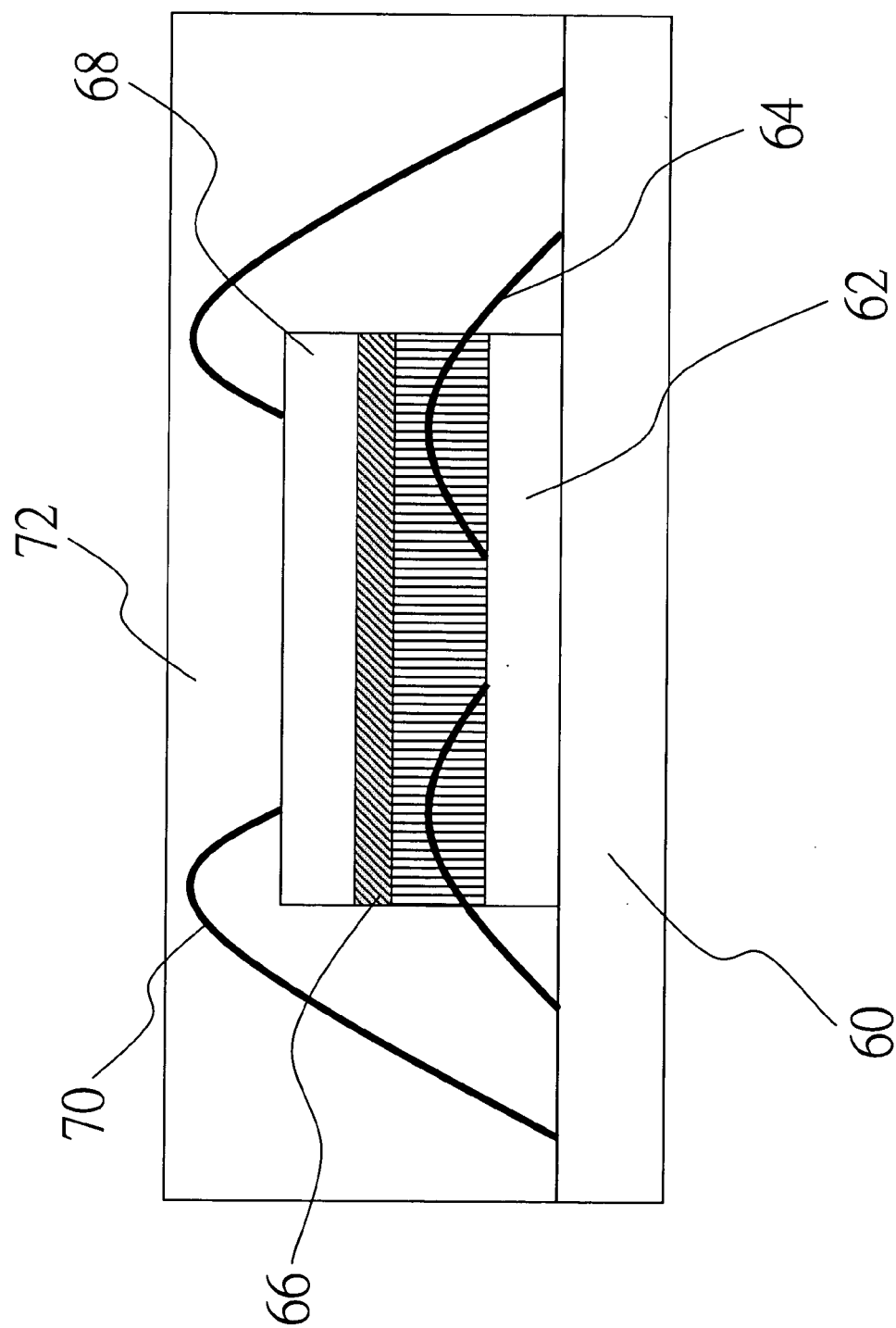
FIG. 4 is a sectional view showing the packaging structure of the invention.
Figure 5:
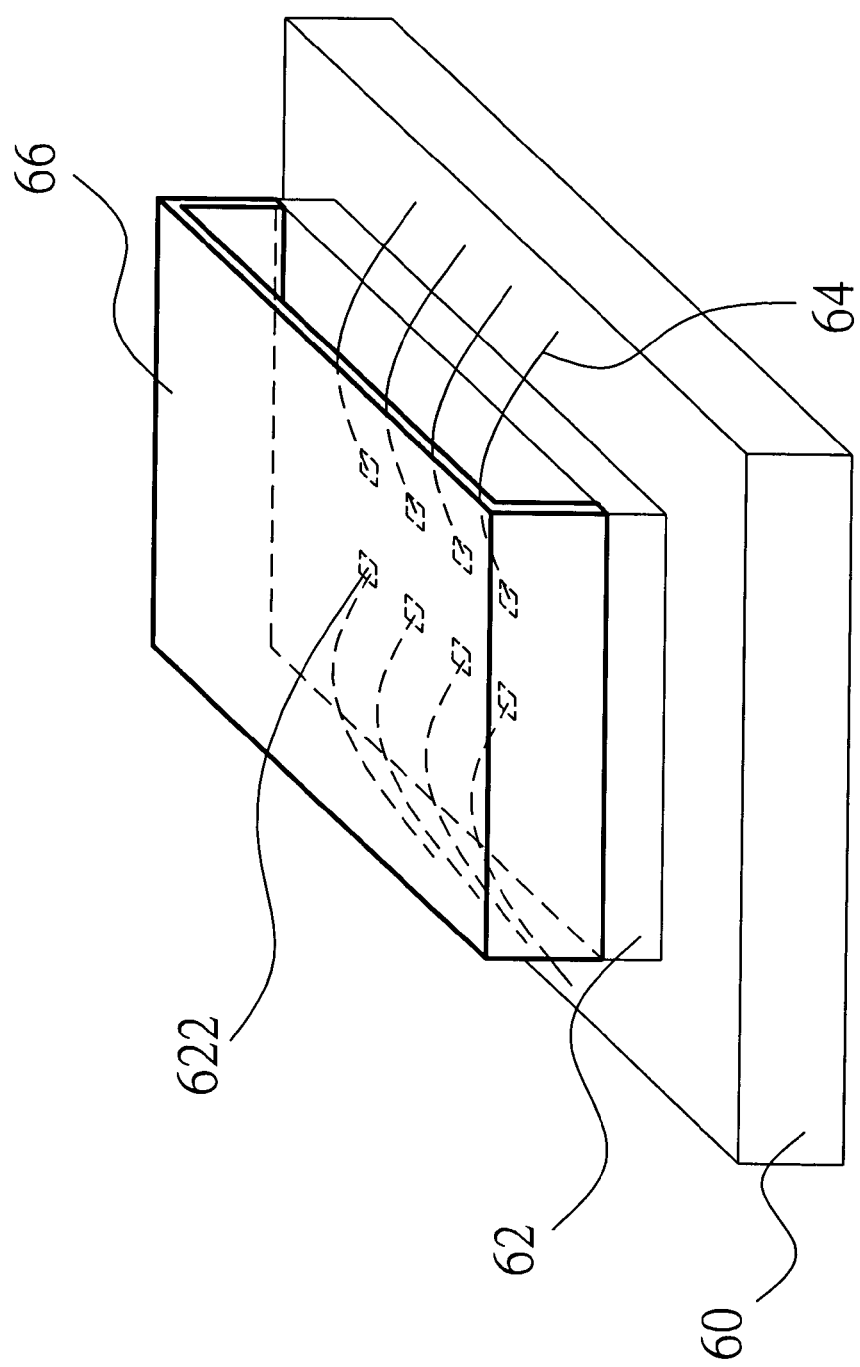
FIG. 5 is a schematic diagram showing a three-dimensional partial structure of the invention.

Referring to FIGS. 4 and 5, a multiple stacked-chip packaging structure is first to provide a middle-type lower layer chip 62 on a substrate 60, and then a plurality of wires 64 are electrically connected to the bonding pads 622 on the lower layer chip 62 and to the substrate 60. Next, a n-shaped carrier cap 66 is provided on the lower layer chip 62, wherein the n-shaped carrier cap 66 is made of thermal conductive material, and the height of n-shaped carrier cap 66 is taller than that of the wires 64 on the lower layer chip 62. Additionally, the n-shaped carrier cap 66 is detached from the bonding pads 622 on the lower layer chip 62 so that the accommodating space provided by the n-shaped carrier cap 66 can protect the bonding pads 622 on the lower layer chip 62 and the wires 64. After that, an upper layer chip 68 is provided on the upper surface of the n-shaped carrier cap 66, and then a plurality of wires 70 are electrically connected to the bonding pads (not shown) on the upper layer chip 68 and to the substrate 60. Finally, a molding compound 72 is used to wrap up the foregoing components.

In particular, besides that the layout pattern of the bonding pads 622 on the lower layer chip 62 can be a middle type, the layout pattern can also be a peripheral type or mixed type.

Thus, the n-shaped carrier cap 66 can be used to separate the upper layer chip 68 from the lower layer chip 62 so that the wires 64 on the lower layer chip 62 can be effectively protected by the n-shaped carrier cap 66. In addition, the n-shaped carrier cap 66 will not deform no matter if it is under a high temperature or a low temperature. Therefore, it will not be a concern whether the conventional adhesive layer is going to generate a collapsing situation. Therefore, when the wire bonding is performed, the degree of coplanar can be effectively maintained. Additionally, because the n-shaped carrier cap 66 can maintain an expected height, it will not affect or impair the wires 64, nor will it result in an open or short circuit on the wires 64. Moreover, by means of the design of n-shaped carrier cap 66, the bonding pads 622 on the lower layer chip 62 can be distributed freely without being subject to a certain type of chip. Therefore, a better way of heat dissipating is provided to enhance the heat-dissipating capability of the overall packaging structure.

Figure 6:
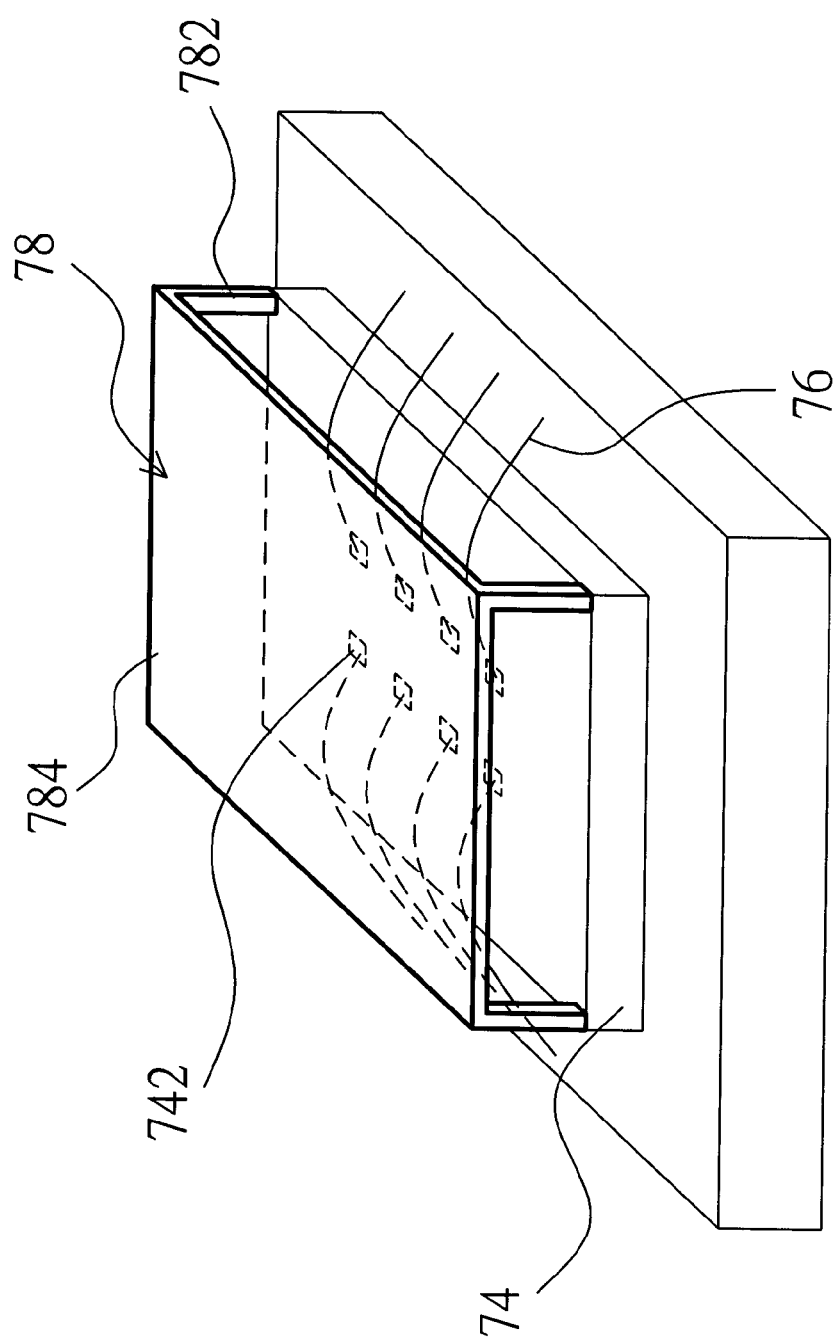
FIG. 6 is a schematic diagram showing a three-dimensional partial structure of another embodiment of the invention.

Furthermore, as shown in FIG. 6, either a supporting set 784 or a plurality of supporting columns 782 may form carrier cap 78. The supporting columns 782 are provided on a lower layer chip 74 and used to maintain a certain height to bear the supporting set 784, whereas the supporting set 784 is used to bear the upper layer chip (not shown). Besides, the accommodating space that is provided by the supporting set 784 and the supporting columns 782 for the wires 76 and the bonding pads 742 allows the wires 76 on the lower layer chip 74 not to be affected by the supporting columns 782, and the wires 76 can be protected as well. Finally, the bonding pads 742 on the lower layer chip 74 can be distributed freely so as to provide a better way for heat dissipating.

The invention is to provide a multiple stacked-chip packaging structure, which will not be affected by the layout patterns of bonding pads on the chip and can be designed freely. In other words, the chip with either middle-type or mixed-type bonding pads can be placed on the upper layer or lower layer of the structure without damaging the wires. In addition, a design of carrier cap is employed to ensure the degree of coplanar when performing wire bonding on the upper layer chip so as to facilitate the wire bonding process. By such design, the problem that the degree of coplanar of the conventional nonconductive adhesive layer is not easy to be controlled can be resolved, and a fixed space between the upper layer and the lower layer can be maintained to protect the wires on the lower layer chip. Meanwhile, a better way of heat dissipating can be provided in order to enhance the heat-dissipating capability of the overall packaging structure. The invention incorporates the conventional wire-bonding process into the present sophisticated technique; therefore, the process cost can be reduced effectively as well.

The embodiments above are only intended to illustrate the invention; they do not, however, to limit the invention to the specific embodiments. Accordingly, various modifications and changes may be made without departing from the spirit and scope of the invention as described in the appended claims.

What is claimed is:

1. A multiple stacked-chip packaging structure, including:
 a substrate;
 at least one lower layer chip located on and in contiguous contact with the substrate, wherein a plurality of wires are respectively electrically connected to a plurality of bonding pads on the lower layer chip and to the substrate;
 at least one carrier cap located on the lower layer chip and having an open cavity overlaying at least a portion of the plurality of bonding pads to provide an accommodating space to the bonding pads and the wires, the carrier cap having open sides in open communication with the accommodating space for passage of the wires therethrough;
 at least one upper layer chip located on an upper surface of the carrier cap, wherein a plurality of wires are respectively electrically connected to a plurality of bonding pads on the upper layer chip and to the substrate; and
 a molding compound to encapsulate the foregoing components.

2. The multiple stacked-chip packaging structure as claimed in claim 1, wherein layout patterns of bonding pads on the upper layer chip and the lower layer chip can be classified into three categories: peripheral type, middle type, and mixed type.

3. The multiple stacked-chip packaging structure as claimed in claim 1, wherein the carrier cap is made of thermal conductive material.

4. A multiple stacked-chip packaging structure, comprising:
 a substrate;
 at least one lower layer chip located on the substrate, wherein a plurality of wires are respectively electrically connected to a plurality of bonding pads on the lower layer chip and to the substrate;
 at least one carrier cap having an n-shaped structure and being located on the lower layer chip to provide an accommodating space to the bonding pads and the wires;

at least one upper layer chip located on the upper surface of the carrier cap, wherein a plurality of wires are respectively electrically connected to a plurality of bonding pads on the upper layer chip and to the substrate; and a molding compound to encapsulate the foregoing components.

5. A multiple stacked-chip packaging structures, comprising:

a substrate;

at least one lower layer chip located on the substrate, wherein a plurality of wires are respectively electrically connected to a plurality of bonding pads on the lower layer chip and to the substrate;

at least one carrier being located on the lower layer to provide an accommodating space to the bonding pads and the wires, the carrier cap being formed by a supporting set and a plurality of supporting columns, the supporting columns being provided on the lower layer chip to bear the supporting set;

at least one upper layer chip supported on the supporting set, wherein a plurality of wires are respectively electrically connected to a plurality of bonding pads on the upper layer chip and to the substrate; and a molding compound to encapsulate the foregoing components.

* * * * *